Figure 1:
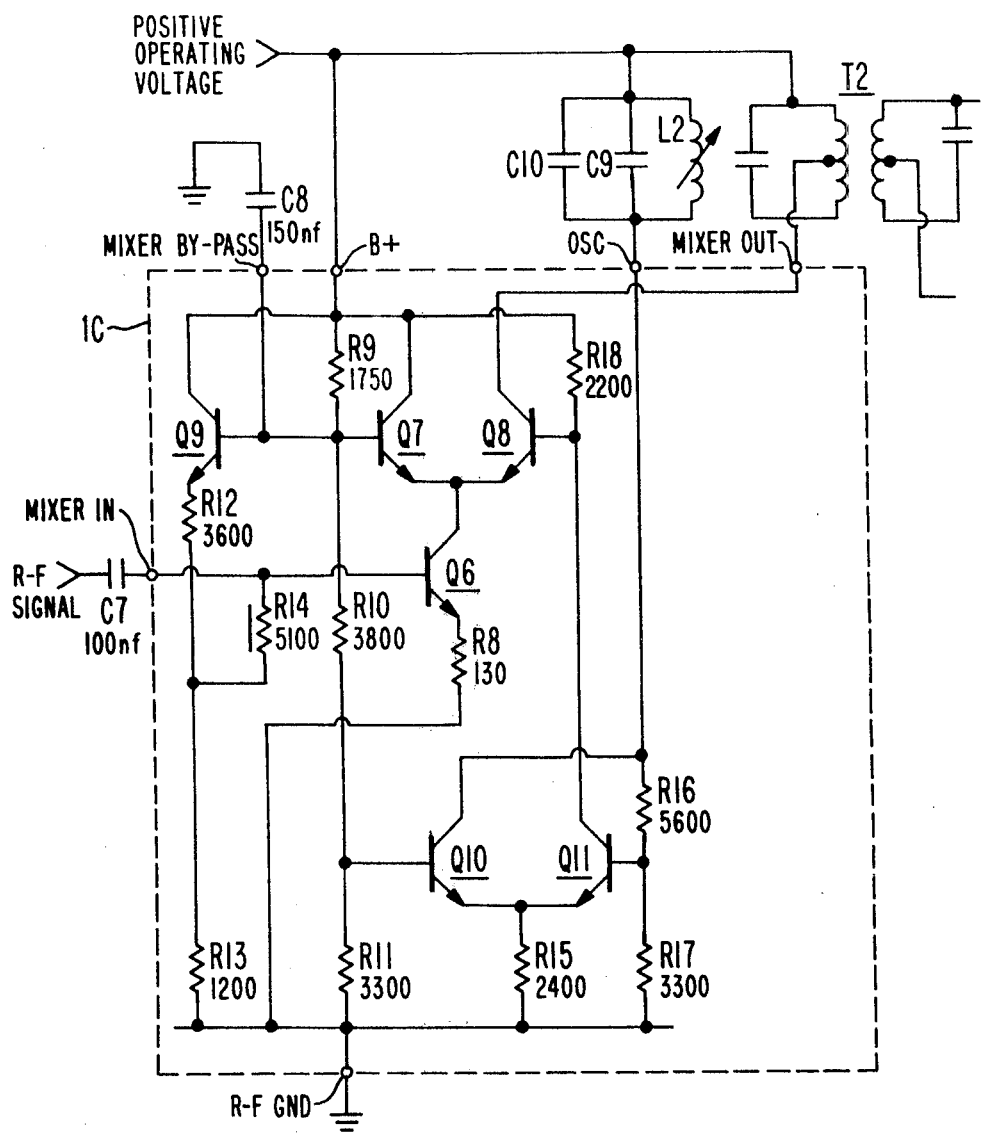

United States Patent [19]

Malchow

[11] 4,253,196
[45] Feb. 24, 1981

[54] FREQUENCY CONVERTER, AS FOR FIRST DETECTOR OF HETERODYNE RADIO RECEIVER

[75] Inventor: Max E. Malchow, Raritan Township, Somerset County, N.J.

[73] Assignee: RCA Corporation, New York, N.Y.

[21] Appl. No.: 112,173

[22] Filed: Jan. 15, 1980

Related U.S. Application Data

[63] Continuation-in-part of Ser. No. 968,443, Dec. 11, 1978.

[51] Int. Cl.³ ............................................. H04B 1/28
[52] U.S. Cl. .................................. 455/319; 455/333
[58] Field of Search ............... 455/318, 313, 319, 323, 455/333; 363/159

[56] References Cited

U.S. PATENT DOCUMENTS

| 3,241,078 | 6/1963 | Jones | 329/50 |
| 3,302,118 | 11/1964 | Schoen | 455/333 |
| 3,432,759 | 3/1969 | Stone | 455/333 |
| 3,609,556 | 9/1971 | Benson et al. | 455/333 |
| 4,058,771 | 10/1976 | Ohsawa et al. | 455/333 |

Primary Examiner—Jin F. Ng
Attorney, Agent, or Firm—Eugene M. Whitacre; Paul J. Rasmussen; Allen LeRoy Limberg

[57] ABSTRACT

A frequency converter including a first pair of transistors with an interconnection between their emitters for receiving a unidirectional current with signal variations to be converted, at least one of their collectors arranged to supply converted signal currents. A second pair of transistors with an interconnection between their emitter electrodes connected by resistor to reference potential is connected to regenerate oscillations in a tank circuit. One of these transistors has its collector connected to the tank circuit; the other has its base connected to receive scaled-down oscillations from the tank circuit and has its collector provided with a resistive load to develop switching signal to be applied between the base electrodes of the first pair of transistors. Appropriate scaling of the resistive load to the emitter resistor shared by second pair of transistors results in maximum conversion efficiency.

1 Claim, 3 Drawing Figures

FREQUENCY CONVERTER, AS FOR FIRST DETECTOR OF HETERODYNE RADIO RECEIVER

The present application is a continuation-in-part of U.S. patent application Ser. No. 968,443, filed Dec. 11, 1978, incorporated herein by reference.

The present invention is directed to frequency conversion circuitry, as employed for the first detector in a heterodyne radio receiver, having improved conversion gain.

The present invention is embodied in frequency conversion circuitry in which: a unidirectional current including variations at the input signal frequency to be converted is caused to flow through an interconnection at the common electrodes of first and second transistors; the input electrode of the first transistor has a first biasing voltage applied to it; the input electrode of the second transistor has local oscillator output voltage applied to it for switching conduction of the unidirectional current between the first and second transistors; and the output electrode of at least one of these transistors is connected to supply a respective output load means for the frequency converter. The local oscillator is of a specific type comprising third and fourth transistors in long-tailed-pair configuration, an interconnection of their common electrodes being connected by a first resistive element to a point of reference potential. The third transistor has an input electrode with a second biasing voltage applied to it and has an output electrode with regenerative feedback connection to the input electrode of the fourth transistor. The output electrode of the fourth transistor connects to operating voltage via a second resistive element. This second resistive element is of such resistance respective to that of the first resistive element that the local oscillator output voltage developed across the second resistive element when applied to the input electrode of the second transistor results in alternate conduction by the first and second transistors, with each conducting for a substantially 50% duty cycle. A 50% duty cycle for conduction of each of the first and second transistors is associated with maximum conversion efficiency.

Figure 2:
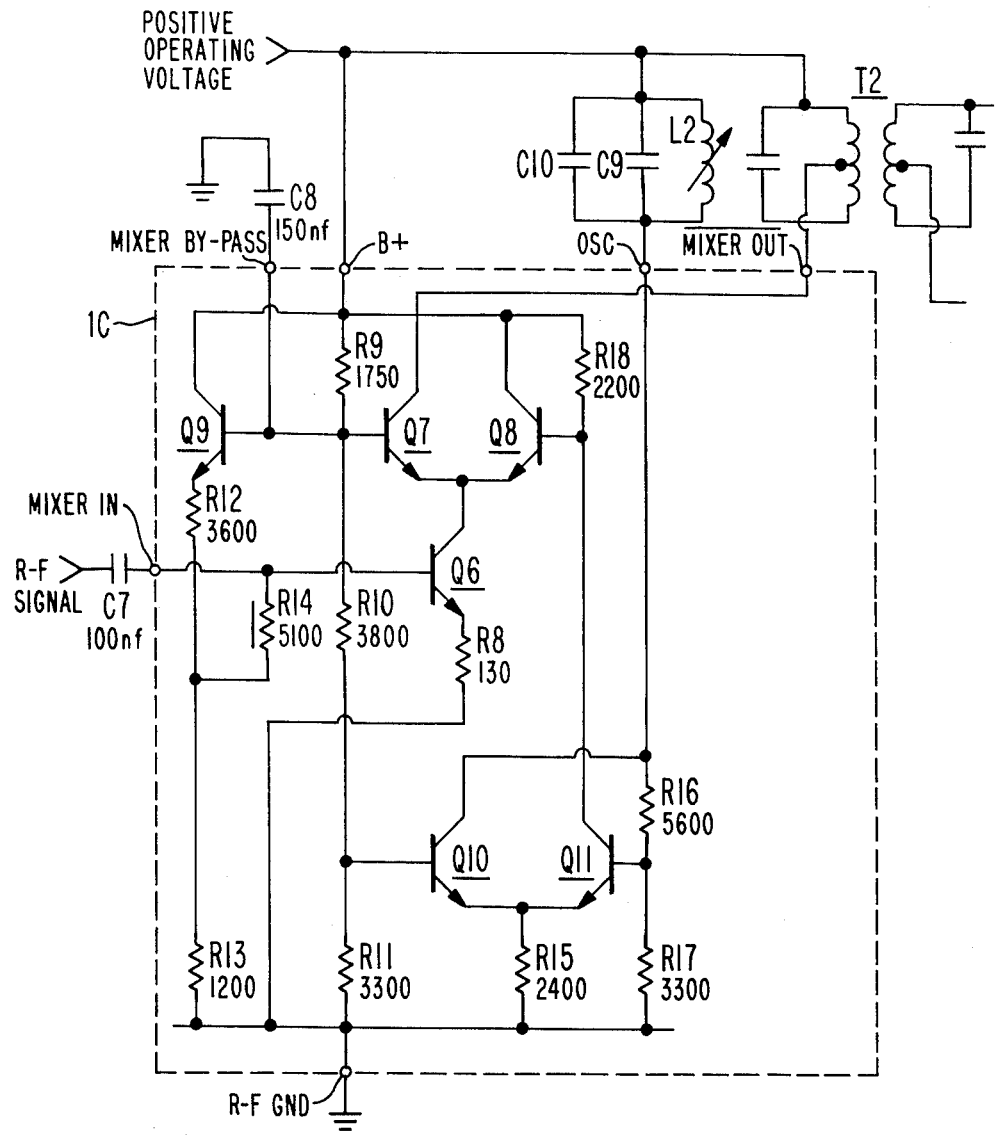
Figure 3:
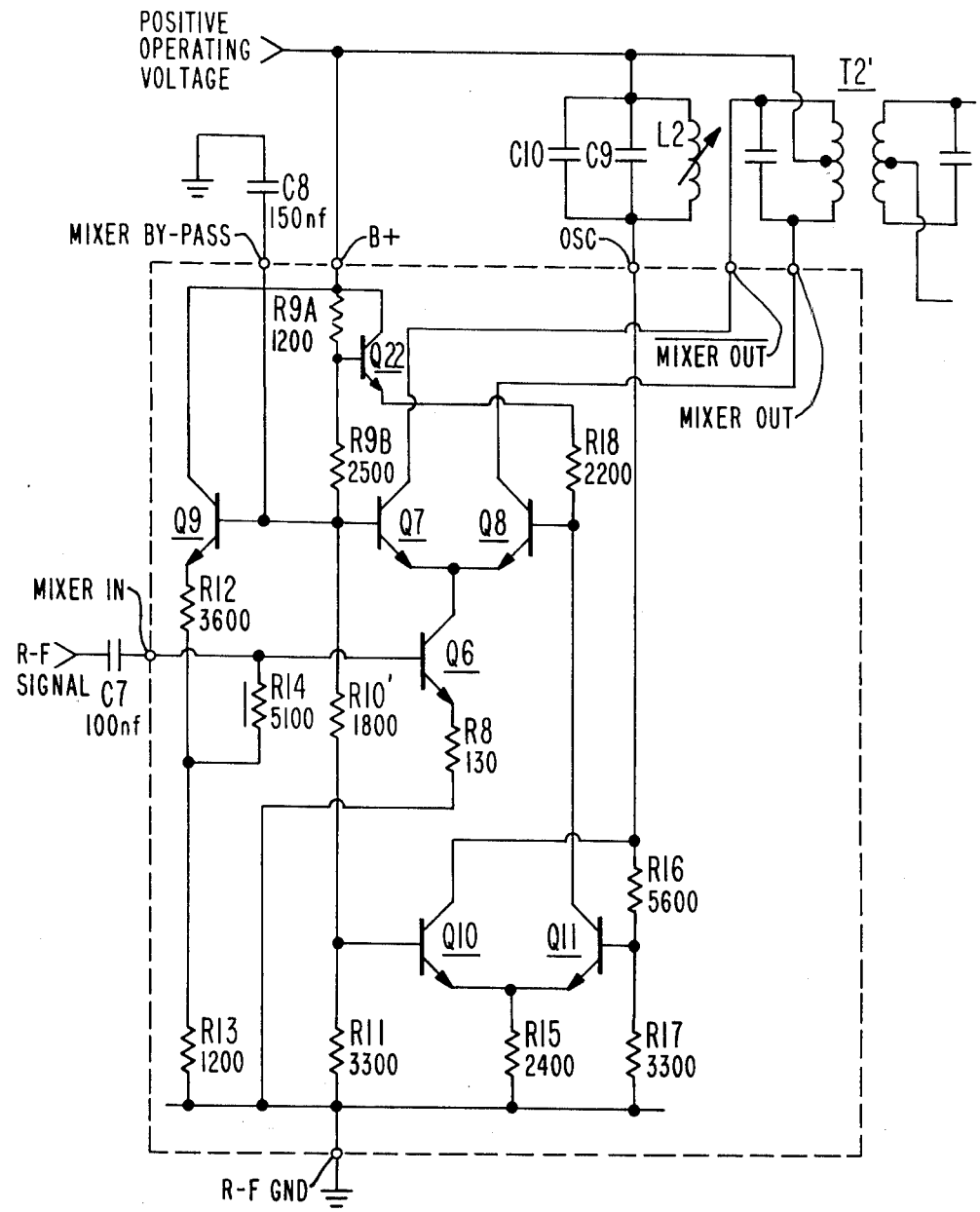

In the drawing:

FIG. 1 is a schematic diagram of the frequency conversion circuitry of the AM radio receiver described in U.S. patent application Ser. No. 968,443, filed Dec. 11, 1978, which circuitry embodies the present invention; and each of FIGS. 2 and 3 is a schematic diagram of a modification of the FIG. 1 frequency conversion circuitry, also embodying the present invention.

Referring to FIG. 1 those elements shown within the dashed-like box IC can be constructed in monolithic integrated circuit form. One terminal RF GND of such an integrated circuit is shown connected to a reference voltage serving as d-c and r-f ground, and another terminal B+ of such an integrated circuit is connected to receive a positive operating potential.

The amplified and transformed r-f signal applied to the mixer input terminal MIXER IN via C7 is in turn applied to the base of NPN transistor Q6 to modulate its conduction. To permit Q6 to handle larger input signals linearly, it is provided with an emitter degeneration resistor R8 for providing linearization by current feedback. Q6 provides a source of modulated tail current to the emitter-to-emitter connection of long-tailed-pair NPN transistors Q7 and Q8. The base electrodes of Q7 and another NPN transistor Q9 connect at a terminal MIXER BY-PASS for r-f by-passing to ground via capacitor C8.

The base electrodes of Q7 and Q9 also receive a direct bias potential from the interconnection of resistors R9 and R10. R9, R10 and a resistor R11 are connected serially in order of naming between the B+ and RF GND terminals. Q9 has a further resistive voltage divider in its emitter circuit. This divider includes resistors R12 and R13 connected serially in order of naming from the emitter of Q9 to RF GND, and a resistor R14 biases the base electrode of Q6 from the interconnection of R12 and R13. R14 is preferably a pinch resistor, as shown, so any variation of the $h_{fe}$ of Q6 during the course of manufacturing is compensated by the attendant variation in the resistance of R14 and thus the potential drop across R4. Accordingly, Q6 will operate at more constant collector current and thus at more constant $g_m$. The emitter-follower action of Q9 decouples the base of Q7 from amplified r-f signal appearing at MIXER IN and conducted by R14 and R12; and the negative temperature coefficient of its $V_{BE}$ causes slightly more positive base potential to be applied to Q6 with increased temperature to overcome the tendency for its $g_m$ to reduce with increased temperature. The divided voltage appearing at the interconnection of R10 and R11 is applied to the base of NPN transistor Q10 as its base potential $V_{BQ10}$.

The collector electrode of Q10 connects via a terminal OSC to the local-oscillator tank circuit comprising paralleled capacitors C9 and C10 in addition to inductor L12, which tunes with them and completes the path for direct current from B+ terminal to OSC terminal and the collector of Q10. The emitter of Q10 connects to RF GND through resistor R15 and limits the emitter current $I_{EQ10}$ of Q10 when NPN transistor Q11, connected emitter-to-emitter with Q10, is non-conductive. Q11 will be non-conductive and Q10, conductive when the base potential $V_{BQ11}$ of Q11 is appreciably less positive than $V_{BQ10}$; and Q11 will be conductive and Q10, non-conductive when $V_{BQ11}$ is appreciably more positive than $V_{BQ10}$. $V_{BQ11}$ is derived by potential division from the OSC terminal on the local-oscillator tank circuit, completing a regenerative feedback loop through the long-tailed-pair amplifier connection of Q11 and Q10 that sustains oscillations in the local oscillator tank. Resistors R15 and R16 connected serially in order of naming between the OSC and RF GND terminals form a resistive potential divider for this purpose, the interconnection between them providing $V_{BQ11}$. $V_{BQ11}$ varies sinusoidally at local-oscillator frequency to gate the transistors Q10 and Q11 into conduction on alternate half cycles of local-oscillator frequency. The potential divider comprising R16 and R17 is proportioned vis-a-vis the voltage divider comprising R9, R10, and R11 so the quiescent values of $V_{BQ10}$ and $V_{BQ11}$ are at the same design center voltages, with R9 being reduced in resistance to allow for the combined base currents of Q7 and Q9 increasing the potential drop thereacross. The resistance of R15 is chosen low enough respective to the resistance of the series connection of R16 and R17 so that regenerative loop including Q10 has sufficient gain to maintain oscillations in the local oscillator tank circuit. The collector current of Q11 flows through a resistor R18, connecting the base electrode of Q8 to the B+ terminal, and switches Q8 out of conduction during the alternate half cycles of local oscillator frequency during which Q11 is switched into conduction. More particularly, Q8 is switched out of conduction by its base potential $V_{BQ8}$ being pulled down to a value substantially less positive than the base potential $V_{BQ7}$ of Q7, which is in emitter-to-emitter connection with Q8. During the alternate half cycles of local oscillator frequency when Q11 is switched out of conduction, so there is no potential drop across R18, $V_{BQ8}$ rises to $V_{B+}$ potential. This switches Q8 into conduction to divert all of the collector current of Q6 to flow as emitter current to Q8, thus switching Q7 out of conduction. So, the collector current of Q8 available at the MIXER OUT terminal of the integrated circuit IC is a heterodyne signal provided by the collector current of Q6, linearly modulated in accordance with amplified r-f signal, being chopped at local-oscillation rate. This provides extremely linear mixer action.

The heterodyne signal current flowing through the MIXER OUT terminal flows through the primary winding of a double-tuned immediate frequency (IF) transformer T2, which provides a path for the d-c collector current of Q8 to flow from the positive operating voltage input. The selectivity afforded by transformer coupling through T2 filters against r-f, the local oscillator frequency, and unwanted components of their heterodyning in favor of the intermediate frequency of choice.

A novel aspect of the mixer is that the long-tailed-pair connection of Q7 and Q8 is not arranged so the respective quiescent base potentials $V_{BQ7}$ and $V_{BQ8}$ of Q7 and Q8 are nominally the same. The inventor discovered while puttering with the mixer that suprisingly it has appreciably more conversion gain when the resistance of R18 is chosen smaller than it would be for making $V_{BQ7}$ equal $V_{BQ8}$ when $V_{BQ11}$ equals $V_{BQ10}$.

A rationale for this result has been developed. A first step in developing this rationale was making a theoretical analysis of the mixing action afforded by the alternate switching of Q7 and Q8 into conduction. The collector current of Q8 is chopped input signal current to be converted in frequency as applied to the joined emitters of Q7 and Q8, chopping occurring in the alternate conduction of Q7 and Q8 as the local oscillator output voltage developed across R18 swings relatively negative and relatively positive, respectively. The collector current of Q8 is, then, equal to the input signal times a rectangular wave switching between zero and unity values. The Fourier series of this function can be shown to exhibit the strongest content of frequency equal to the difference between input signal frequency and fundamental frequency of the rectangular wave when that rectangular wave is a square wave—i.e., when the duty cycle for conduction of Q7 and Q8 is 50%.

This result was introconvertible mathematically, forcing the conclusion that if one chooses R18 of such value that $V_{BQ7}$ equals $V_{BQ8}$ when $V_{BQ11}$ equals $V_{BQ10}$, the duty cycle for conduction of Q8 must exhibit a departure from the optimum 50% value. A second step in developing a rationale for improved conversion gain was to investigate the circuit performance to find out the reason for this departure. It was found by oscilloscopic observation of the voltage waveform at the base of Q7 as referred to the voltage at the base of Q8 that 50% duty cycle for conduction of Q8 was indeed achieved for the reduced value of R18 obtained by puttering, rather than with R18 of such value that $V_{BQ7}$ equals $V_{BQ8}$ under the quiescent conditions when $V_{BQ11}$ equals $V_{BQ10}$.

The voltage waveform was of a different sort than anticipated, however, rather than being square on downward excursions the waves exhibited a superimposed segment of a "sine-wave" portion. It then became clear to the inventor that the average value of the collector current of Q11 when local oscillations are present is not substantially one-half the quiescent tail current drawn from the emitters of Q10 and Q11 when there are no local oscillations—e.g. when one-short circuits the tank elements C9, C10, L2. The base-emitter junction of Q11 rectifies the upward excursions of local oscillator voltage at the base of Q11, as applied by the emitter follower action of Q11 to R15. This increases the value of current flowing through R15 during the upward excursions of local oscillator voltage at the base of Q11—i.e., during the very times Q11 is conductive to develop a potential drop across R18. The reduced value of R18 espoused for the present invention is, then, reduced to accommodate the increased current flow through Q11 caused by the rectifying action of its base-emitter junction increasing the potential across R15.

In work with this mixer subsequent to the Dec. 11, 1978 filing of U.S. patent application Ser. No. 960,443 it has been found desirable to allow increased voltage swing at the MIXER OUT terminal. One way to do this is to change the collector connections of Q7 and Q8 to be to a $\overline{\text{MIXER OUT}}$ terminal and to the B+ terminal respectively, as shown in FIG. 2. This takes advantage of the greater collector voltage swing available to Q7 by virtue of its base potential from B+ potential by the resistive potential divider action of R9, R10, and R11.

FIG. 3 shows the resistive potential divider being rescaled, replacing R10 with a lower-resistance resistor R10' and replacing R9 with a higher-resistance series connection of resistors R9A and R9B. This places the base of Q7 closer to r-f ground in potential. Further the voltage at the top point between R9A and R9B is applied to the base of an NPN emitter-follower transistor Q22, which provides at its emitter electrode a direct voltage less than B+ operating potential for R18 to connect back to. This reduces the upward swing at the base of Q8 when Q11 is switched out of conduction, permitting larger negative-going voltage swing at the MIXER OUT terminal, to which the collector of Q8 connects, before there is risk of the collector-base junction of Q8 undesirably being forward biased. This facilitates push-pull drive to the primary winding of transformer T2 as shown, or single-ended drive from MIXER OUT terminal with the collector of Q7 being returned to B+ operating voltage, or single-ended drive from $\overline{\text{MIXER OUT}}$ terminal with the collector of Q8 being returned to B+ operating voltage.

Since the duty cycle for conduction of Q7 is 50% when that of Q8 is, the highest conversion gain from the collector of Q7 is achieved with the same value of R18 as used for achieving highest conversion gain from the collector of Q8.

What is claimed is:

1. Frequency conversion circuitry comprising:
   first, second, third and fourth transistors of the same conductivity type, each having an input electrode and having common and output electrodes defining the ends of its principal current conduction path, the conductivity of which is controlled responsive to the potential between its common and input electrodes;

first and second terminals for application of reference and operating voltages, respectively;

a third terminal for application of a first biasing voltage intermediate to said reference and operating voltages, which third terminal connects to the input electrode of said first transistor;

a fourth terminal for application of a second biasing voltage intermediate to said reference and first biasing voltages, which fourth terminal connects to the input electrode of said third transistor.

means, responsive to an input frequency to be converted, for applying to an interconnection between the common electrodes of said first and second transistors, a unidirectional current of a polarity tending to cause them to conduct current;

respective means connecting the output electrodes of said first and second transistors to said second terminal, at least one of which includes load means for receiving converted input signal;

first resistive means with a first end connected to said first terminal and with a second end connected to an interconnection between the common electrodes of said third and fourth transistors;

means providing regenerative feedback connection from the output electrode of said third transistor to the input electrode of said fourth transistor for generating local oscillations that switch the third and fourth transistors into alternate conduction; and second resistive means with a first end connected to said second terminal, with a second end to which the output electrode of said fourth transistor connects, and of a resistance respective to that of said first resistive means such that local oscillator output voltage appearing at its second end responsive to alternate conduction of said fourth transistor, which local oscillator output voltage is applied to the input electrode of said second transistor, results in alternate conduction of said first and second transistors with each conducting for a substantially 50% duty cycle, 50% duty cycle being associated with maximum conversion efficiency.

* * * * *